(12) United States Patent
Miyake (10) Patent No.: US 9,230,994 B2
(45) Date of Patent: Jan. 5, 2016

(54) LIQUID CRYSTAL DISPLAY DEVICE (75) Inventor: Hiroyuki Miyake, Atsugi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 939 days.

(21) Appl. No.: 13/212,510

(22) Filed: Aug. 18, 2011

(65) Prior Publication Data

US 2012/0062811 A1    Mar. 15, 2012

(30) Foreign Application Priority Data

Sep. 15, 2010  (JP) ................................. 2010-206282

(51) Int. Cl.
  *G02F 1/1343* (2006.01)
  *H01L 27/12* (2006.01)
  *G02F 1/1362* (2006.01)

(52) U.S. Cl.
  CPC ...... *H01L 27/1225* (2013.01); *G02F 1/136213* (2013.01); *H01L 27/1255* (2013.01)

(58) Field of Classification Search
  CPC .................................................. G06F 1/136213
  USPC ..................................................... 349/39, 48
  See application file for complete search history.

(56) References Cited

U.S. PATENT DOCUMENTS

| | | |
|---|---|---|
| 5,534,884 A | 7/1996 | Mase et al. |
| 5,731,856 A | 3/1998 | Kim et al. |
| 5,737,049 A | 4/1998 | Shin et al. |
| 5,744,864 A | 4/1998 | Cillessen et al. |
| 5,745,195 A | 4/1998 | Zhang |
| 5,748,169 A | 5/1998 | Okumura et al. |
| 5,982,460 A | 11/1999 | Zhang et al. |
| 6,005,543 A | 12/1999 | Kimura |
| 6,052,103 A | 4/2000 | Fujiwara et al. |

(Continued)

FOREIGN PATENT DOCUMENTS

| | | |
|---|---|---|
| EP | 1239323 A | 9/2002 |
| EP | 1391429 A | 2/2004 |

(Continued)

OTHER PUBLICATIONS

Fortunato.E et al., "Wide-Bandgap High-Mobility ZnO Thin-Film Transistors Produced at Room Temperature,", Appl. Phys. Lett. (Applied Physics Letters) , Sep. 27, 2004, vol. 85, No. 13, pp. 2541-2543.

(Continued)

*Primary Examiner* — Wen-Ying P Chen
(74) *Attorney, Agent, or Firm* — Eric J. Robinson; Robinson Intellectual Property Law Office, P.C.

(57) ABSTRACT

An object of the present invention is to provide a liquid crystal display device which allows a desirable storage capacitor to be ensured in a pixel without decreasing the aperture ratio in response to changes in frame frequency. In a liquid crystal display device including a pixel transistor and two capacitive elements using an oxide semiconductor material in each pixel, one of the capacitive elements comprises a light-transmitting material to improve the aperture ratio of the pixel. Furthermore, through the use of characteristics of the light-transmitting capacitive element, the size of the storage capacitor in the pixel is varied by adjusting the voltage value of a capacitance value in response to the frame frequency varied depending on images displayed.

11 Claims, 8 Drawing Sheets

(56) References Cited

U.S. PATENT DOCUMENTS

| | | |
|---|---|---|
| 6,166,714 A | 12/2000 | Kishimoto |
| 6,169,532 B1 | 1/2001 | Sumi et al. |
| 6,218,219 B1 | 4/2001 | Yamazaki et al. |
| 6,294,274 B1 | 9/2001 | Kawazoe et al. |
| 6,317,109 B1 | 11/2001 | Lee |
| 6,324,113 B1 | 11/2001 | Tomita |
| 6,392,623 B1 | 5/2002 | Shimada |
| 6,407,431 B2 | 6/2002 | Yamazaki et al. |
| 6,535,191 B1 | 3/2003 | Miyachi |
| 6,563,174 B2 | 5/2003 | Kawasaki et al. |
| 6,573,564 B2 | 6/2003 | Yamazaki et al. |
| 6,590,552 B1 | 7/2003 | Yokoyama et al. |
| 6,690,031 B1 | 2/2004 | Ohtani et al. |
| 6,727,522 B1 | 4/2004 | Kawasaki et al. |
| 6,894,734 B1 | 5/2005 | Ihara |
| 6,919,597 B2 | 7/2005 | Cho et al. |
| 6,952,244 B2 | 10/2005 | Cairns et al. |
| 7,002,541 B2 | 2/2006 | Yanagi et al. |
| 7,023,141 B2 | 4/2006 | Anzai et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,276,856 B2 | 10/2007 | Anzai et al. |
| 7,282,782 B2 | 10/2007 | Hoffman et al. |
| 7,297,977 B2 | 11/2007 | Hoffman et al. |
| 7,321,353 B2 | 1/2008 | Tsuda et al. |
| 7,323,356 B2 | 1/2008 | Hosono et al. |
| 7,374,994 B2 | 5/2008 | Cho et al. |
| 7,385,224 B2 | 6/2008 | Ishii et al. |
| 7,402,506 B2 | 7/2008 | Levy et al. |
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,542,018 B2 | 6/2009 | Anzai et al. |
| 7,592,991 B2 | 9/2009 | Anzai et al. |
| 7,674,650 B2 | 3/2010 | Akimoto et al. |
| 7,732,819 B2 | 6/2010 | Akimoto et al. |
| 7,872,261 B2 | 1/2011 | Ikeda |
| 7,892,917 B2 | 2/2011 | Cho et al. |
| 8,102,476 B2 | 1/2012 | Son et al. |
| 8,237,162 B2 | 8/2012 | Arai |
| 8,476,625 B2 | 7/2013 | Kimura |
| 2001/0024187 A1 | 9/2001 | Sato et al. |
| 2001/0046027 A1 | 11/2001 | Tai et al. |
| 2002/0056838 A1 | 5/2002 | Ogawa |
| 2002/0075205 A1 | 6/2002 | Kimura et al. |
| 2002/0080131 A1 | 6/2002 | Fujino |
| 2002/0093473 A1 | 7/2002 | Tanaka et al. |
| 2002/0132454 A1 | 9/2002 | Ohtsu et al. |
| 2002/0180675 A1 | 12/2002 | Tobita et al. |
| 2003/0122127 A1 | 7/2003 | Yonekura et al. |
| 2003/0156104 A1 | 8/2003 | Morita |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2004/0232421 A1 | 11/2004 | Ono et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0119755 A1 | 6/2006 | Senda et al. |
| 2006/0163583 A1 | 7/2006 | Jiroku |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0152921 A1 | 7/2007 | Osame |
| 2007/0164331 A1 | 7/2007 | Aiin et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0236640 A1 | 10/2007 | Kimura |
| 2007/0252928 A1 | 11/2007 | Ito et al. |
| 2007/0272922 A1 | 11/2007 | Kim et al. |
| 2007/0273682 A1 | 11/2007 | Yi et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0158138 A1* | 7/2008 | Yamazaki et al. ............ 345/102 |
| 2008/0166834 A1 | 7/2008 | Kim et al. |
| 2008/0170028 A1 | 7/2008 | Yoshida |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0284931 A1 | 11/2008 | Kimura |
| 2008/0296568 A1 | 12/2008 | Ryu et al. |
| 2009/0015533 A1 | 1/2009 | Fujita et al. |
| 2009/0068773 A1 | 3/2009 | Lai et al. |
| 2009/0072226 A1 | 3/2009 | Koo et al. |
| 2009/0073325 A1 | 3/2009 | Kuwabara et al. |
| 2009/0114910 A1 | 5/2009 | Chang |
| 2009/0134399 A1 | 5/2009 | Sakakura et al. |
| 2009/0141203 A1 | 6/2009 | Son et al. |
| 2009/0152506 A1 | 6/2009 | Umeda et al. |
| 2009/0152541 A1 | 6/2009 | Maekawa et al. |
| 2009/0184911 A1 | 7/2009 | Fukutome |
| 2009/0231503 A1* | 9/2009 | Yen ............................. 349/38 |
| 2009/0278122 A1 | 11/2009 | Hosono et al. |
| 2009/0280600 A1 | 11/2009 | Hosono et al. |
| 2009/0283762 A1 | 11/2009 | Kimura |
| 2009/0310077 A1 | 12/2009 | Kim et al. |
| 2010/0065844 A1 | 3/2010 | Tokunaga |
| 2010/0072468 A1 | 3/2010 | Yamazaki et al. |
| 2010/0092800 A1 | 4/2010 | Itagaki et al. |
| 2010/0109002 A1 | 5/2010 | Itagaki et al. |
| 2010/0140613 A1 | 6/2010 | Kimura |
| 2010/0214272 A1 | 8/2010 | Watsuda |
| 2011/0032435 A1 | 2/2011 | Kimura |
| 2011/0037787 A1 | 2/2011 | Yoshiga |
| 2011/0133183 A1 | 6/2011 | Yamazaki et al. |
| 2011/0148846 A1 | 6/2011 | Arasawa et al. |
| 2011/0157131 A1 | 6/2011 | Miyake |

(56) References Cited

U.S. PATENT DOCUMENTS

| | | |
|---|---|---|
| 2012/0319107 A1 | 12/2012 | Miyake |
| 2013/0157393 A1 | 6/2013 | Kimura |
| 2013/0280858 A1 | 10/2013 | Kimura |

FOREIGN PATENT DOCUMENTS

| | | |
|---|---|---|
| EP | 1737044 A | 12/2006 |
| EP | 2226847 A | 9/2010 |
| EP | 2579237 A | 4/2013 |
| JP | 60-198861 A | 10/1985 |
| JP | 63-088523 A | 4/1988 |
| JP | 63-210022 A | 8/1988 |
| JP | 63-210023 A | 8/1988 |
| JP | 63-210024 A | 8/1988 |
| JP | 63-215519 A | 9/1988 |
| JP | 63-239117 A | 10/1988 |
| JP | 63-265818 A | 11/1988 |
| JP | 05-251705 A | 9/1993 |
| JP | 08-264794 A | 10/1996 |
| JP | 11-103066 A | 4/1999 |
| JP | 11-505377 | 5/1999 |
| JP | 11-202292 A | 7/1999 |
| JP | 2000-044236 A | 2/2000 |
| JP | 2000-150900 A | 5/2000 |
| JP | 2000-206565 A | 7/2000 |
| JP | 2000-227611 A | 8/2000 |
| JP | 2000-310766 A | 11/2000 |
| JP | 2001-093277 A | 4/2001 |
| JP | 2001-282205 A | 10/2001 |
| JP | 2002-072248 A | 3/2002 |
| JP | 2002-076356 A | 3/2002 |
| JP | 2002-289859 A | 10/2002 |
| JP | 2002-357850 A | 12/2002 |
| JP | 2003-086000 A | 3/2003 |
| JP | 2003-086808 A | 3/2003 |
| JP | 2003-323159 | 11/2003 |
| JP | 2004-045662 A | 2/2004 |
| JP | 2004-103957 A | 4/2004 |
| JP | 2004-273614 A | 9/2004 |
| JP | 2004-273732 A | 9/2004 |
| JP | 2005-215702 A | 8/2005 |
| JP | 2009-302520 A | 12/2009 |
| JP | 2010-098280 A | 4/2010 |
| JP | 2010-098305 | 4/2010 |
| JP | 2010-114213 A | 5/2010 |
| JP | 2010-156963 A | 7/2010 |
| KR | 2004-0013401 A | 2/2004 |
| WO | WO-2004/114391 | 12/2004 |
| WO | WO-2011/148537 | 12/2011 |

OTHER PUBLICATIONS

Dembo.H et al., "RFCPUS on Glass and Plastic Substrates Fabricated by TFT Transfer Technology,", IEDM 05: Technical Digest of International Electron Devices Meeting, Dec. 5, 2005, pp. 1067-1069.

Ikeda.T et al., "Full-Functional System Liquid Crystal Display Using CG-Silicon Technology,", SID Digest '04 : SID International Symposium Digest of Technical Papers, 2004, vol. 35, pp. 860-863.

Nomura.K et al., "Room-Temperature Fabrication of Transparent Flexible Thin-Film Transistors Using Amorphous Oxide Semiconductors,", Nature, Nov. 25, 2004, vol. 432, pp. 488-492.

Park.J et al., "Improvements in the Device Characteristics of Amorphous Indium Gallium Zinc Oxide Thin-Film Transistors by Ar Plasma Treatment,", Appl. Phys. Lett. (Applied Physics Letters) , Jun. 26, 2007, vol. 90, No. 26, pp. 262106-1-262106-3.

Takahashi.M et al., "Theoretical Analysis of IGZO Transparent Amorphous Oxide Semiconductor,", IDW '08 : Proceedings of the 15th International Display Workshops, Dec. 3, 2008, pp. 1637-1640.

Hayashi.R et al., "42.1: Invited Paper: Improved Amorphous In—Ga—Zn—O TFTs,", SID Digest '08 : SID International Symposium Digest of Technical Papers, May 20, 2008, vol. 39, pp. 621-624.

Prins.M et al., "A Ferroelectric Transparent Thin-Film Transistor,", Appl. Phys. Lett. (Applied Physics Letters) , Jun. 17, 1996, vol. 68, No. 25, pp. 3650-3652.

Nakamura.M et al., "The phase relations in the $In_2O_3$—$Ga_2ZnO_4$—ZnO system at 1350° C.", Journal of Solid State Chemistry, Aug. 1, 1991, vol. 93, No. 2, pp. 298-315.

Kimizuka.N et al., "Syntheses and Single-Crystal Data of Homologous Compounds, $In_2O_3(ZnO)m$ (m=3, 4, and 5), $InGaO_3(ZnO)_3$, and $Ga_2O_3(ZnO)m$ (m=7, 8, 9 and 16) in the $In_2O_3$—$ZnGa_2O_4$—ZnO System,", Journal of Solid State Chemistry, Apr. 1, 1995, vol. 116, No. 1, pp. 170-178.

Nomura.K et al., "Thin-Film Transistor Fabricated in Single-Crystalline Transparent Oxide Semiconductor,", Science, May 23, 2003, vol. 300, No. 5623, pp. 1269-1272.

Masuda.S et al., "Transparent thin film transistors using ZnO as an active channel layer and their electrical properties,", J. Appl. Phys. (Journal of Applied Physics) , Feb. 1, 2003, vol. 93, No. 3, pp. 1624-1630.

Asakuma.N et al., "Crystallization and Reduction of Sol-Gel-Derived Zinc Oxide Films by Irradiation With Ultraviolet Lamp,", Journal of Sol-Gel Science and Technology, 2003, vol. 26, pp. 181-184.

Osada.T et al., "15.2: Development of Driver-Integrated Panel using Amorphous In—Ga—Zn—Oxide TFT,", SID DIGEST '09 : SID International Symposium Digest of Technical Papers, May 31, 2009, pp. 184-187.

Nomura.K et al., "Carrier transport in transparent oxide semiconductor with intrinsic structural randomness probed using single-crystalline $InGaO_3(ZnO)_5$ films,", Appl. Phys. Lett. (Applied Physics Letters) , Sep. 13, 2004, vol. 85, No. 11, pp. 1993-1995.

Li.C et al., "Modulated Structures of Homologous Compounds $InMO_3(ZnO)m$ (M=In,Ga; m=Integer) Described by Four-Dimensional Superspace Group,", Journal of Solid State Chemistry, 1998, vol. 139, pp. 347-355.

Son.K et al., "42.4L: Late-News Paper: 4 Inch QVGA AMOLED Driven by the Threshold Voltage Controlled Amorphous GIZO ($Ga_2O_3$—$In_2O_3$—ZnO) TFT,", SID Digest '08 : SID International Symposium Digest of Technical Papers, May 20, 2008, vol. 39, pp. 633-636.

Lee.J et al., "World's Largest (15-Inch) XGA AMLCD Panel Using IGZO Oxide TFT,", SID Digest '08 : SID International Symposium Digest of Technical Papers, May 20, 2008, vol. 39, pp. 625-628.

Nowatari.H et al., "60.2: Intermediate Connector With Suppressed Voltage Loss for White Tandem OLEDs,", SID Digest '09 : SID International Symposium Digest of Technical Papers, May 31, 2009, vol. 40, pp. 899-902.

Kanno.H et al., "White Stacked Electrophosphorecent Organic Light-Emitting Devices Employing $MoO_3$ as a Charge-Generation Layer,", Adv. Mater. (Advanced Materials), 2006, vol. 18, No. 3, pp. 339-342.

Tsuda.K et al., "Ultra Low Power Consumption Technologies for Mobile TFT-LCDs ,", IDW '02 : Proceedings of the 9th International Display Workshops, Dec. 4, 2002, pp. 295-298.

Van de Walle.C, "Hydrogen as a Cause of Doping in Zinc Oxide,", Phys. Rev. Lett. (Physical Review Letters), Jul. 31, 2000, vol. 85, No. 5, pp. 1012-1015.

Fung.T et al., "2-D Numerical Simulation of High Performance Amorphous In—Ga—Zn—O TFTs for Flat Panel Displays,", AM-FPD '08 Digest of Technical Papers, Jul. 2, 2008, pp. 251-252, The Japan Society of Applied Physics.

Jeong.J et al., "3.1: Distinguished Paper: 12.1-Inch WXGA AMOLED Display Driven by Indium—Gallium—Zinc Oxide TFTs Array,", SID Digest '08 : SID International Symposium Digest of Technical Papers, May 20, 2008, vol. 39, No. 1, pp. 1-4.

Park.J et al., "High performance amorphous oxide thin film transistors with self-aligned top-gate structure,", IEDM 09: Technical Digest of International Electron Devices Meeting, Dec. 7, 2009, pp. 191-194.

Kurokawa.Y et al., "UHF RFCPUS on Flexible and Glass Substrates for Secure RFID Systems,", Journal of Solid-State Circuits , 2008, vol. 43, No. 1, pp. 292-299.

(56) References Cited

OTHER PUBLICATIONS

Ohara.H et al., "Amorphous In—Ga—Zn—Oxide TFTs with Suppressed Variation for 4.0 inch QVGA AMOLED Display,", AM-FPD '09 Digest of Technical Papers, Jul. 1, 2009, pp. 227-230, The Japan Society of Applied Physics.

Coates.D et al., "Optical Studies of the Amorphous Liquid-Cholesteric Liquid Crystal Transition:The "Blue Phase",", Physics Letters, Sep. 10, 1973, vol. 45A, No. 2, pp. 115-116.

Cho.D et al., "21.2:Al and Sn-Doped Zinc Indium Oxide Thin Film Transistors for AMOLED Back-plane,", SID Digest '09 : SID International Symposium Digest of Technical Papers, May 31, 2009, pp. 280-283.

Lee.M et al., "15.4:Excellent Performance of Indium—Oxide-Based Thin-Film Transistors by DC Sputtering,", SID Digest '09 : SID International Symposium Digest of Technical Papers, May 31, 2009, pp. 191-193.

Jin.D et al., "65.2:Distinguished Paper:World-Largest (6.5") Flexible Full Color Top Emission AMOLED Display on Plastic Film and Its Bending Properties,", SID Digest '09 : SID International Symposium Digest of Technical Papers, May 31, 2009, pp. 983-985.

Sakata.J et al., "Development of 4.0-In. AMOLED Display With Driver Circuit Using Amorphous In—Ga—Zn—Oxide TFTs,", IDW '09 : Proceedings of the 16th International Display Workshops, 2009, pp. 689-692.

Park.J et al., "Amorphous Indium—Gallium—Zinc Oxide TFTs and Their Application for Large Size AMOLED,", AM-FPD '08 Digest of Technical Papers, Jul. 2, 2008, pp. 275-278.

Park.S et al., "Challenge to Future Displays: Transparent AM-OLED Driven by Peald Grown ZnO TFT,", IMID '07 Digest, 2007, pp. 1249-1252.

Godo.H et al., "Temperature Dependence of Characteristics and Electronic Structure for Amorphous In—Ga—Zn—Oxide TFT,", AM-FPD '09 Digest of Technical Papers, Jul. 1, 2009, pp. 41-44.

Osada.T et al., "Development of Driver-Integrated Panel Using Amorphous In—Ga—Zn—Oxide TFT,", AM-FPD '09 Digest of Technical Papers, Jul. 1, 2009, pp. 33-36.

Hirao.T et al., "Novel Top-Gate Zinc Oxide Thin-Film Transistors (ZnO TFTs) for AMLCDs,", Journal of the SID , 2007, vol. 15, No. 1, pp. 17-22.

Hosono.H, "68.3:Invited Paper:Transparent Amorphous Oxide Semiconductors for High Performance TFT,", SID Digest '07 : SID International Symposium Digest of Technical Papers, 2007, vol. 38, pp. 1830-1833.

Godo.H et al., "P-9:Numerical Analysis on Temperature Dependence of Characteristics of Amorphous In—Ga—Zn—Oxide TFT,", SID Digest '09 : SID International Symposium Digest of Technical Papers, May 31, 2009, pp. 1110-1112.

Ohara.H et al., "21.3:4.0 In. QVGA AMOLED Display Using In—Ga—Zn—Oxide TFTs With a Novel Passivation Layer,", SID Digest '09 : SID International Symposium Digest of Technical Papers, May 31, 2009, pp. 284-287.

Miyasaka.M, "SUFTLA Flexible Microelectronics on Their Way to Business,", SID Digest '07 : SID International Symposium Digest of Technical Papers, 2007, vol. 38, pp. 1673-1676.

Chern.H et al., "An Analytical Model for the Above-Threshold Characteristics of Polysilicon Thin-Film Transistors,", IEEE Transactions on Electron Devices, Jul. 1, 1995, vol. 42, No. 7, pp. 1240-1246.

Kikuchi.H et al., "39.1:Invited Paper:Optically Isotropic Nano-Structured Liquid Crystal Composites for Display Applications,", SID Digest '09 : SID International Symposium Digest of Technical Papers, May 31, 2009, pp. 578-581.

Asaoka.Y et al., "29.1:Polarizer-Free Reflective LCD Combined With Ultra Low-Power Driving Technology,", SID Digest '09 : SID International Symposium Digest of Technical Papers, May 31, 2009, pp. 395-398.

Lee.H et al., "Current Status of, Challenges to, and Perspective View of AM-OLED ,", IDW '06 : Proceedings of the 13th International Display Workshops, Dec. 7, 2006, pp. 663-666.

Kikuchi.H et al., "62.2:Invited Paper:Fast Electro-Optical Switching in Polymer-Stabilized Liquid Crystalline Blue Phases for Display Application,", SID Digest '07 : SID International Symposium Digest of Technical Papers, 2007, vol. 38, pp. 1737-1740.

Nakamura, "Synthesis of Homologous Compound with New Long-Period Structure,", NIRIM Newsletter, Mar. 1, 1995, vol. 150, pp. 1-4.

Kikuchi.H et al., "Polymer-Stabilized Liquid Crystal Blue Phases,", Nature Materials, Sep. 1, 2002, vol. 1, pp. 64-68.

Kimizuka.N et al., "Spinel,YbFe2O4, and Yb2Fe3O7 Types of Structures for Compounds in the In2O3 and Sc2O3—A2O3—BO Systems [A; Fe, Ga, or Al; B: Mg, Mn, Fe, Ni, Cu,or Zn] at Temperatures Over 1000° C.", Journal of Solid State Chemistry, 1985, vol. 60, pp. 382-384.

Kitzerow.H et al., "Observation of Blue Phases in Chiral Networks,", Liquid Crystals, 1993, vol. 14, No. 3, pp. 911-916.

Costello.M et al., "Electron Microscopy of a Cholesteric Liquid Crystal and Its Blue Phase,", Phys. Rev. A (Physical Review. A), May 1, 1984, vol. 29, No. 5, pp. 2957-2959.

Meiboom.S et al., "Theory of the Blue Phase of Cholesteric Liquid Crystals,", Phys. Rev. Lett. (Physical Review Letters), May 4, 1981, vol. 46, No. 18, pp. 1216-1219.

Park.Sang-Hee et al., "42.3: Transparent ZnO Thin Film Transistor for the Application of High Aperture Ratio Bottom Emission AM-OLED Display,", SID Digest '08 : SID International Symposium Digest of Technical Papers, May 20, 2008, vol. 39, pp. 629-632.

Orita.M et al., "Mechanism of Electrical Conductivity of Transparent InGaZnO4,", Phys. Rev. B (Physical Review. B), Jan. 15, 2000, vol. 61, No. 3, pp. 1811-1816.

Nomura.K et al., "Amorphous Oxide Semiconductors for High-Performance Flexible Thin-Film Transistors,", Jpn. J. Appl. Phys. (Japanese Journal of Applied Physics) , 2006, vol. 45, No. 5B, pp. 4303-4308.

Janotti.A et al., "Native Point Defects in ZnO,", Phys. Rev. B (Physical Review. B), 2007, vol. 76, pp. 165202-1-165202-22.

Park.J et al., "Electronic Transport Properties of Amorphous Indium—Gallium—Zinc Oxide Semiconductor Upon Exposure to Water,", Appl. Phys. Lett. (Applied Physics Letters) , 2008, vol. 92, pp. 072104-1-072104-3.

Hsieh.H et al., "P-29:Modeling of Amorphous Oxide Semiconductor Thin Film Transistors and Subgap Density of States,", SID Digest '08 : SID International Symposium Digest of Technical Papers, 2008, vol. 39, pp. 1277-1280.

Janotti.A et al., "Oxygen Vacancies in ZnO,", Appl. Phys. Lett. (Applied Physics Letters) , 2005, vol. 87, pp. 122102-1-122102-3.

Oba.F et al., "Defect energetics in ZnO: A hybrid Hartree-Fock density functional study,", Phys. Rev. B (Physical Review. B), 2008, vol. 77, pp. 245202-1-245202-6.

Orita.M et al., "Amorphous transparent conductive oxide InGaO3(ZnO)m (m<4):a Zn4s conductor,", Philosophical Magazine, 2001, vol. 81, No. 5, pp. 501-515.

Hosono.H et al., "Working hypothesis to explore novel wide band gap electrically conducting amorphous oxides and examples,", J. Non-Cryst. Solids (Journal of Non-Crystalline Solids), 1996, vol. 198-200, pp. 165-169.

Mo.Y et al., "Amorphous Oxide TFT Backplanes for Large Size AMOLED Displays,", IDW '08 : Proceedings of the 6th International Display Workshops, Dec. 3, 2008, pp. 581-584.

Kim.S et al., "High-Performance oxide thin film transistors passivated by various gas plasmas,", 214th ECS Meeting, 2008, No. 2317.

Clark.S et al., "First Principles Methods Using CASTEP,", Zeitschrift fur Kristallographie, 2005, vol. 220, pp. 567-570.

Lany.S et al., "Dopability, Intrinsic Conductivity, and Nonstoichiometry of Transparent Conducting Oxides,", Phys. Rev. Lett. (Physical Review Letters), Jan. 26, 2007, vol. 98, pp. 045501-1-045501-4.

Park.J et al., "Dry etching of ZnO films and plasma-induced damage to optical properties,", J. Vac. Sci. Technol. B (Journal of Vacuum Science & Technology B), Mar. 1, 2003, vol. 21, No. 2, pp. 800-803.

Oh.M et al., "Improving the Gate Stability of ZnO Thin-Film Transistors With Aluminum Oxide Dielectric Layers,", J. Electrochem. Soc. (Journal of the Electrochemical Society), 2008, vol. 155, No. 12, pp. H1009-H1014.

(56) References Cited

OTHER PUBLICATIONS

Ueno.K et al., "Field-Effect Transistor on SrTiO3 With Sputtered Al2O3 Gate Insulator,", Appl. Phys. Lett. (Applied Physics Letters), Sep. 1, 2003, vol. 83, No. 9, pp. 1755-1757.

Amano.S et al., "Low Power LC Display Using In—Ga—Zn—Oxide TFTs Based on Variable Frame Frequency", SID Digest '10 : SID International Symposium Digest of Technical Papers, 2010, pp. 626-629.

Nishi.T et al., "P-143: Possibility of Reflective LC Display Using Oxide Semiconductor TFTs as Electronic Paper Display", SID Digest '10 : SID International Symposium Digest of Technical Papers, May 1, 2010, vol. 41, No. 1, pp. 1685-1688.

Godo.H et al., "Modeling and Measurement of Ultra-Low Leakage Current of IGZO TFTs and New Driving Method of LCDs", IDW '10 : Proceedings of the 16th Internatinal Display Workshops, 2010, pp. 235-238.

Notice of Allowance (U.S. Appl. No. 13/599,323) dated Mar. 19, 2014.

Allowed Claims (U.S. Appl. No. 13/599,323 as of Mar. 19, 2014).

Korean Office Action (Application No. 2012-0098758) Dated Nov. 4, 2013.

* cited by examiner

LIQUID CRYSTAL DISPLAY DEVICE

BACKGROUND OF THE INVENTION

1. Field of the Invention

The present invention relates to liquid a crystal display device.

2. Description of the Related Art

In recent years, flat panel displays such as liquid crystal displays (LCDs) have been becoming widespread. While materials using amorphous silicon or polycrystalline silicon have been commonly used as semiconductor layer materials for thin film transistors, light-transmitting metal oxides have been also attracting attention. For example, techniques for improving the aperture ratio have been examined through the application of an In—Ga—Zn—O-based oxide or the like to a channel layer of a thin film transistor. In addition, Patent Document 1 discloses a technique for manufacturing a thin film transistor which has parasitic capacitance reduced and prevents defects caused by peeling of a thin film.

Non-Patent Document 1 discloses a structure for varying a frame frequency between in the case of displaying a moving image and in the case of displaying a still image in order to achieve a reduction in the power consumption of a liquid crystal display device.

REFERENCES

[Patent Document 1] Japanese Published Patent Application No. 2010-098305

[Non-Patent Document 1] Kazuhiko Tsuda et al., IDW'02, pp. 295-298

SUMMARY OF THE INVENTION

In the case of a lower frame frequency (1/600 Hz to 1 Hz) for displaying a still image, the storage capacitor in a pixel is advantageously larger in order to make the holding time of electric signals such as image signals longer and maintain more favorable still image display. However, when a design is made so as to increase the storage capacitor in a pixel, problems such as a decrease in the aperture ratio of the pixel and a need to increase the channel width of a pixel transistor will be caused. In addition, in order to prevent flicker noises (flickers) and achieve smoother moving image display, the frame frequency is increased for moving image display (60 Hz to 180 Hz). In the case of carrying out color display by a sequential method, the frame frequency is further increased (180 Hz to 480 Hz). In this case, there is no need to increase the storage capacitor in a pixel, because electric signals such as image signals are switched quickly. More specifically, it is extremely difficult to ensure an appropriate storage capacitor in a small-area pixel at the same time in both cases of still image display and moving image display.

In view of the problems described above, an object in an embodiment of the present invention disclosed herein is to provide a liquid crystal device which allows a desirable storage capacitor to be ensured in a pixel without decreasing the aperture ratio in response to changes in frame frequency. In addition, another object in an embodiment of the present invention disclosed herein is to provide a liquid crystal display device which allows for lower power consumption and higher-definition image display.

An embodiment of the present invention is a semiconductor device comprising: a pixel transistor including a gate electrode electrically connected to a scan line, a first electrode electrically connected to a signal line, the first electrode serving as one of a source electrode and a drain electrode, and a second electrode electrically connected to a pixel electrode, the second electrode serving as the other of the source electrode and the drain electrode; a first capacitive element including one electrode electrically connected to the second electrode, and the other electrode electrically connected to a capacitance line; and a second capacitive element including one electrode electrically connected to the second electrode, and the other electrode electrically connected to the capacitance line, wherein the second capacitive element has the one electrode formed from the same layer as the pixel electrode, has the other electrode formed from the same semiconductor material as the semiconductor layer of the pixel transistor, and thus has a MOS capacitor structure of a dielectric layer interposed between the one electrode and the other electrode, and the second capacitive element has a capacitance value varied in response to a time interval of a gate pulse by adjusting an electric potential of the capacitance line.

In addition, an embodiment of the present invention is a semiconductor device comprising: a pixel transistor including a gate electrode electrically connected to a scan line, a first electrode electrically connected to a signal line, the first electrode serving as one of a source electrode and a drain electrode, and a second electrode electrically connected to a pixel electrode, the second electrode serving as the other of the source electrode and the drain electrode; a first capacitive element including one electrode electrically connected to the second electrode, and the other electrode electrically connected to a wiring for shielding; and a second capacitive element including one electrode electrically connected to the second electrode, and the other electrode electrically connected to a capacitance line; and a transistor including a gate electrode electrically connected to the wiring for shielding, a first electrode electrically connected to the one electrode of the first capacitive element, the first electrode serving as one of a source electrode and a drain electrode, and a second electrode electrically connected to the capacitance line, the second electrode serving as the other of the source electrode and the drain electrode, wherein the second capacitive element has the one electrode formed from the same layer as the pixel electrode, has the other electrode formed from the same semiconductor material as the semiconductor layer of the pixel transistor, and thus has a MOS capacitor structure of a dielectric layer interposed between the one electrode and the other electrode, and the second capacitive element has a capacitance value varied in response to a time interval of a gate pulse by adjusting an electric potential of the capacitance line and supplying, to the wiring for shielding, such an electric field that turns off the transistor at least during image display.

In addition, in an embodiment of the present invention, the liquid crystal display device is provided wherein the pixel electrode and the semiconductor layer have a light-transmitting property.

In addition, in an embodiment of the present invention, the semiconductor layer may be composed of an oxide semiconductor.

It is to be noted that in this specification, etc., the term such as "over" or "below" does not necessarily mean that a component is placed "directly on" or "directly under" another component. For example, the expression "a gate electrode over a gate insulating layer" can mean the case where there is an additional component between the gate insulating layer and the gate electrode. Further, the terms "over" and "below" are used simply for convenience of explanation.

In addition, in this specification and the like, the term such as "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" is formed in an integrated manner.

Functions of a "source" and a "drain" are sometimes replaced with each other when a transistor of opposite polarity is used or when the direction of current flowing is changed in circuit operation, for example. Therefore, the terms "source" and "drain" can be used to denote the drain and the source, respectively, in this specification.

It is to be noted that in this specification, etc., the term "electrically connected" includes the case where components are connected through "an object which has any "electric action." There is no particular limitation on "the object which has any electric action" as long as electric signals can be transmitted and received between components that are connected through the object.

Examples of the "object which has any electric action" include a switching element such as a transistor, a resistor, an inductor, a capacitor, and other elements with a variety of functions as well as an electrode and a wiring.

According to an embodiment of the present invention, a liquid crystal display device can be achieved which allows a desirable storage capacitor to be ensured in a pixel without decreasing the aperture ratio in response to changes in frame frequency. In addition, a liquid crystal display device can be achieved which allows for lower power consumption and higher-definition image display.

DETAILED DESCRIPTION OF THE INVENTION

Hereinafter, embodiments of the present invention will be described in detail with reference to the accompanying drawings. However, the present invention is not limited to the description below, and it is easily understood by those skilled in the art that modes and details disclosed herein can be modified in various ways without departing from the spirit and the scope of the present invention. Therefore, the present invention is not construed as being limited to description of the embodiments.

It is to be noted that the position, the size, the range, or the like of each structure illustrated in drawings and the like is not accurately represented in some cases for easy understanding. Therefore, the disclosed invention is not necessarily limited to the position, size, range, or the like as disclosed in the drawings and the like.

In this specification and the like, ordinal numbers such as "first", "second", and "third" are used in order to avoid confusion among components, and the terms do not mean limitation of the number of components.

Embodiment 1

In the present embodiment, a pixel structure and a method for switching the storage capacitors will be described in a liquid crystal display device according to an embodiment of the present invention disclosed herein. It is to be noted that the liquid crystal display device described in the present embodiment includes pixels each with a variable capacitance value in response to images displayed.

Figure 1:
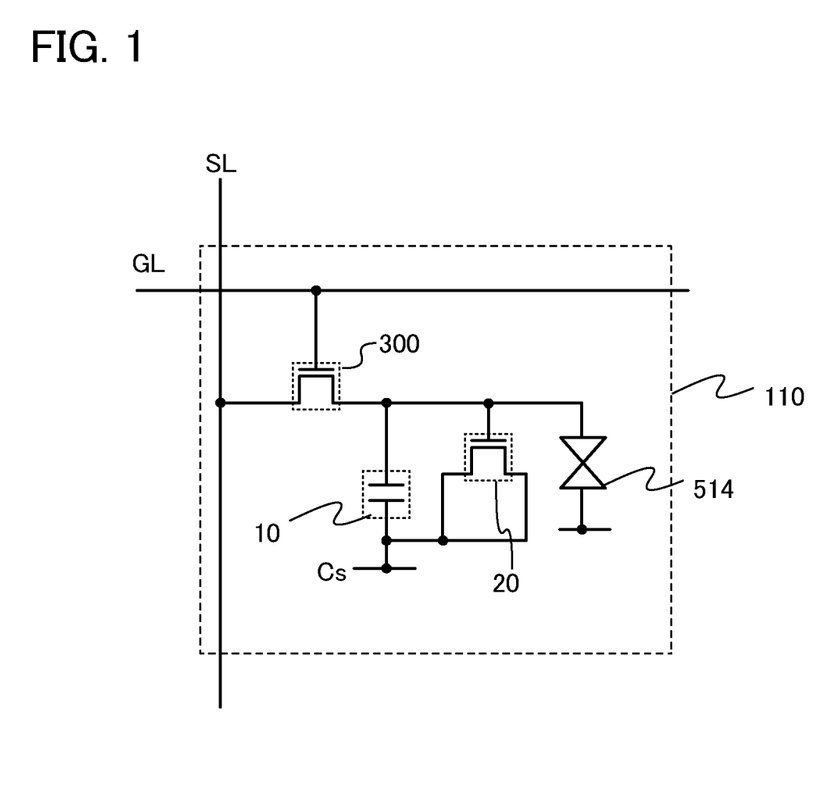
FIG. 1 is a circuit diagram illustrating a pixel structure of a liquid crystal display device.

FIG. 1 is a diagram illustrating a circuit example of a pixel included in the liquid crystal display device.

A pixel 110 includes a pixel transistor 300, a first capacitive element 10, and a second capacitive element 20. The pixel transistor 300 has a gate electrode electrically connected to a scan line GL, and a first electrode electrically connected to a signal line SL, which serves as one of a source electrode and a drain electrode of the pixel transistor 300. Furthermore, one electrode of the first capacitive element 10 is electrically connected to one electrode of the second capacitive element 20, and a second electrode which serves as the other of the source electrode and the drain electrode of the pixel transistor 300, the other electrode of the first capacitive element 10, and the other electrode of the second capacitive element 20 are electrically connected to each other. Further, the one electrode of the first capacitive element 10 and the one electrode of the second capacitive element 20 are electrically connected to a capacitance line Cs.

Figure 2:
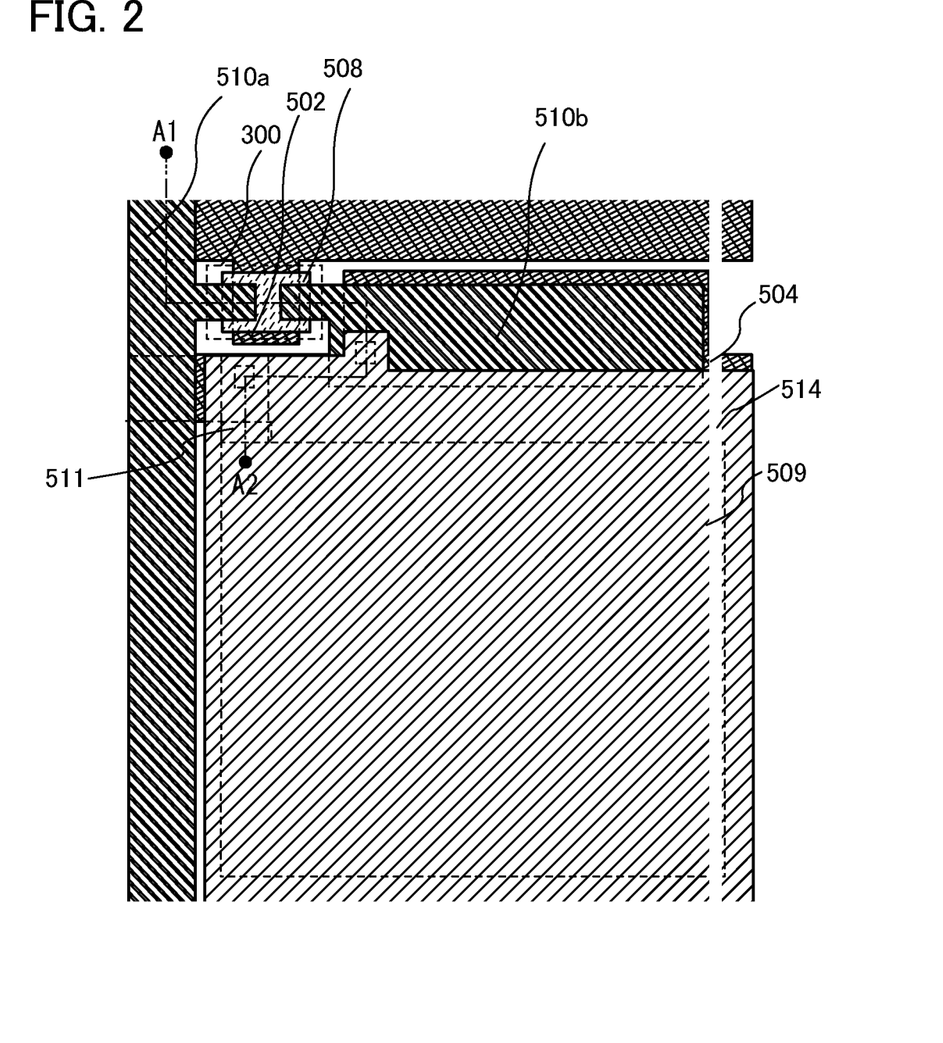
FIG. 2 is a top view illustrating a pixel structure of the liquid crystal display device.
Figure 3:
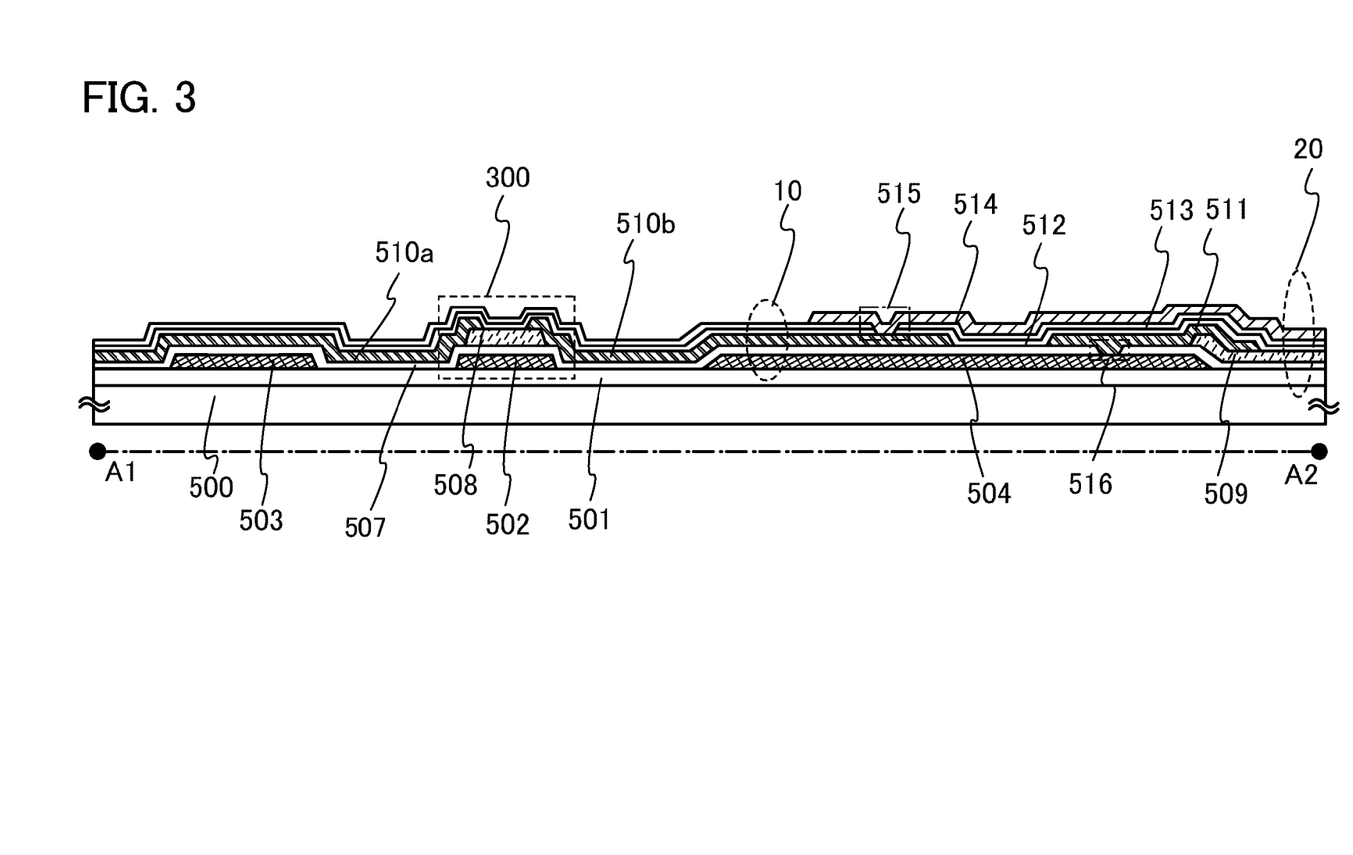
FIG. 3 is a cross-sectional view illustrating a pixel structure of the liquid crystal display device.

Next, an example of the specific structure of the pixel shown in FIG. 1 will be described with reference to FIGS. 2 and 3. FIG. 2 shows a top view of the pixel. In addition, FIG. 3 shows a cross-sectional view of the pixel along the chain line A1-A2 in FIG. 2.

In the cross section A1-A2, a base layer 501 is formed on a substrate 500, and a gate electrode 502, a wiring 503, and a wiring 504 are formed on the base layer 501. In addition, a gate insulating layer 507 is formed to cover the gate electrode 502, the wiring 503, and the wiring 504. Furthermore, a semiconductor layer 508 is formed on the gate insulating layer 507 so as to overlap with the gate electrode 502, and a semiconductor layer 509 is formed on the gate insulating layer 507. In addition, a source electrode 510a and a drain electrode 510b are formed on the semiconductor layer 508 so as to overlap with end portions of the gate electrode 502, and a wiring 511 is formed on the gate insulating layer 507 and the semiconductor layer 509 so as to be in partial contact with the wiring 504. It is to be noted that the wiring 511 is electrically connected to the wiring 504 through a contact hole 516 formed in the gate insulating layer 507. In addition, an insulating layer 512 and an insulating layer 513 are formed sequentially on the source electrode 510a, the drain electrode 510b, and the wiring 511 so as to be in partial contact with the semiconductor layer 508, and a pixel electrode 514 is formed on the insulating layer 513. It is to be noted that the pixel electrode 514 is electrically connected to the drain electrode 510b through a contact hole 515 formed in the insulating layer 512 and the insulating layer 513.

A section in which the wiring 504 and the drain electrode 510b are overlapped with the gate insulating layer 507 interposed therebetween functions as the first capacitive element 10. The gate insulating layer 507 functions as a dielectric layer. In addition, a section in which the semiconductor layer 509 and the pixel electrode 514 are overlapped with the insulating layer 512 and the insulating layer 513 interposed therebetween functions as the second capacitive element 20. The insulating layer 512 and the insulating layer 513 function as a dielectric layer.

The multilayer structure of the dielectric layer can prevent interlayer short circuit caused by pinholes, etc. formed in the insulating layers. More specifically, even when a pinhole is caused in one of the dielectric layers, the pinhole is covered with the other dielectric layer, and the function of the second capacitive element 20 can be thus improved.

The semiconductor layer 508 and the semiconductor layer 509 can be formed with the use of amorphous silicon, microcrystalline silicon, and polycrystalline silicon. However, in the case of driving the pixels at a lower frame frequency, it is preferable to use a semiconductor material which has a wider energy gap than those of the above-mentioned silicon-based semiconductor materials. As the semiconductor material which has a wider energy gap, preferably, oxide semiconductors can be used. For example, zinc-oxide-based oxide semiconductors have an energy gap of approximately 3 eV, which are excellent in a light-transmitting property in a visible light range. While many of these oxide semiconductors exhibits an n-type conductivity, the oxide semiconductors can be brought closer to intrinsic semiconductors by reducing impurities acting as donors, such as hydrogen, and reducing defects caused by oxygen vacancies. This type of highly purified oxide semiconductor can reduce the off-state current of the transistor sufficiently in combination with the wide energy gap.

The pixel transistor 300 configured with the use of the oxide semiconductor for the semiconductor layer 508 can reduce the off-state current, and reduce the ratio of electric charges disappearing from the storage capacitor provided in the pixel. More specifically, even when the frame frequency is lowered, the pixel transistor 300 makes it possible to keep electric charges held in the storage capacitor until the next writing period.

The oxide semiconductor to be used preferably contains at least indium (In) or zinc (Zn). In particular, the oxide semiconductor preferably contains In and Zn. In addition, as a stabilizer for reducing the variation in electric characteristics of a transistor using the oxide, the oxide semiconductor preferably gallium (Ga) in addition to In and Zn. In addition, the oxide semiconductor preferably contains tin (Sn) as a stabilizer. In addition, the oxide semiconductor preferably contains hafnium (Hf) as a stabilizer. In addition, the oxide semiconductor preferably contains aluminum (Al) as a stabilizer.

In addition, as other stabilizer(s), the oxide semiconductor may contain one or more of lanthanoid such as lanthanum (La), cerium (Ce), praseodymium (Pr), neodymium (Nd), samarium (Sm), europium (Eu), gadolinium (Gd), terbium (Tb), dysprosium (Dy), holmium (Ho), erbium (Er), thulium (Tm), ytterbium (Yb), or lutetium (Lu).

For example, an indium oxide, a tin oxide, a zinc oxide, a two-component metal oxide such as an In—Zn-based oxide, a Sn—Zn-based oxide, an Al—Zn-based oxide, a Zn—Mg-based oxide, a Sn—Mg-based oxide, an In—Mg-based oxide, or an In—Ga-based oxide, a three-component metal oxide such as an In—Ga—Zn-based oxide (also referred to as IGZO), an In—Al—Zn-based oxide, an In—Sn—Zn-based oxide, a Sn—Ga—Zn-based oxide, an Al—Ga—Zn-based oxide, a Sn—Al—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide, a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide can be used as the oxide semiconductor.

It is to be noted in this case that, for example, an In—Ga—Zn-based oxide refers to an oxide containing In, Ga, and Zn, and there is no limitation on the ratio of In:Ga:Zn. The In—Ga—Zn-based oxide may contain a metal element besides the In, Ga, and Zn.

Alternatively, a material represented by $InMO_3(ZnO)_m$ (m>0, and m is not an integer) may be used as an oxide semiconductor. It is to be noted that M represents one or more metal elements selected from Ga, Fe, Mn, and Co. Alternatively, a material represented by $In_2SnO_5(ZnO)_n$ (n>0, n is a natural number) may be used as the oxide semiconductor.

For example, an In—Ga—Zn-based oxide with an atomic ratio of In:Ga:Zn=1:1:1 (=1/3:1/3:1/3) or In:Ga:Zn=2:2:1 (=2/5:2/5:1/5), or an oxide whose composition is in the neighborhood of the In—Ga—Zn-based oxide can be used. Alternatively, an In—Sn—Zn-based oxide with an atomic ratio of In:Sn:Zn=1:1:1 (=1/3:1/3:1/3), In:Sn:Zn=2:1:3 (=1/3:1/6:1/2), or In:Sn:Zn=2:1:5 (=1/4:1/8:5/8), or an oxide whose composition is in the neighborhood of the In—Sn—Zn-based oxide may be used.

However, the oxide semiconductor is not limited to those described above, and a material which has an appropriate composition may be used depending on required semiconductor characteristics (e.g., mobility, threshold voltage, and variation). In addition, in order to obtain the required semiconductor characteristics, it is preferable to make the carrier concentration, the impurity concentration, the defect density, the atomic ratio of a metal element to oxygen, the interatomic distance, the density, etc. appropriate.

In addition, a configuration is desirably used in which the semiconductor layer 508 of the pixel transistor 300 is overlapped with the gate electrode 502. The adoption of this configuration can prevent the oxide semiconductor in the semiconductor layer 508 from being deteriorated due to incident light from the substrate 500 side. Thus, characteristic degradation such as the shifted threshold voltage of the pixel transistor 300 can be prevented from being caused.

For the pixel electrode 514, a light-transmitting conductive material is preferably used. As the light-transmitting conductive material, materials can be used such as an indium tin oxide containing a silicon oxide (ITSO), an indium tin oxide (ITO), a zinc oxide (ZnO), an indium zinc oxide (IZO), and a gallium-doped zinc oxide (GZO). It is to be noted that the light-transmitting conductive material refers to a material which has a visible light transmittance of 75% to 100% in the specification.

The use of the oxide semiconductor for the semiconductor layer 509 and the use of the light-transmitting conductive material for the pixel electrode 514 make it possible to form the light-transmitting second capacitive element 20. Therefore, the aperture ratio of the pixel 110 can be improved. When the area of the second capacitive element 20 accounts for 70 percent or more or 80 percent or more of the pixel pitch, a liquid crystal display device can be achieved which has a further improved aperture ratio.

Next, a specific method for varying the value of the storage capacitor will be described for the pixel shown in FIGS. 1 through 3.

Figure 4A:
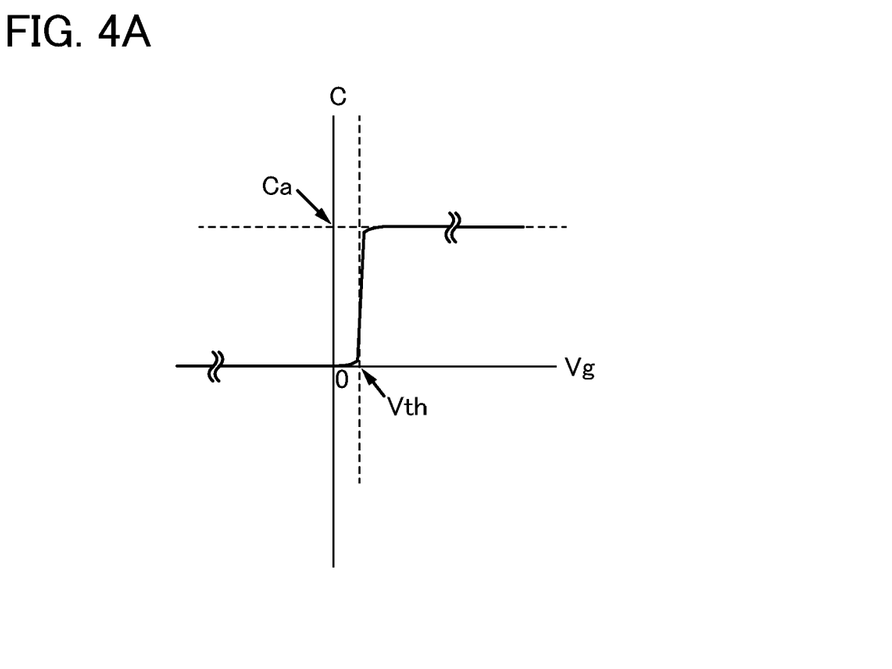
FIGS. 4A and 4B are respectively a diagram showing capacitance-voltage characteristics and a relationship diagram of voltage.

FIG. 4A shows capacitance (C)-voltage (Vg) characteristics of a MOS capacitor, where the horizontal axis indicates a gate voltage Vg, whereas the vertical axis indicates a capacitance C. The second capacitive element 20 formed of the semiconductor layer 509 and the pixel electrode 514 overlapped with the insulating layer 512 and the insulating layer 513 interposed therebetween constitutes a MOS capacitor. The MOS capacitor has the characteristics of, as shown in FIG. 4A, failing to function as a capacitive element when the voltage value is lower than a certain threshold voltage Vth, and functioning as a capacitive element only when the voltage value is the certain threshold voltage Vth or more.

Figure 4B:
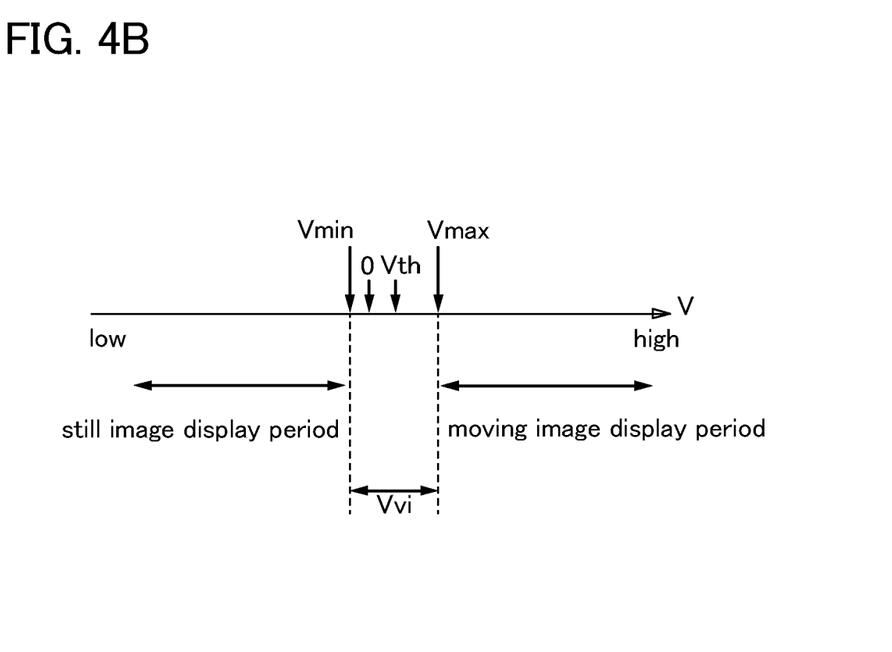

FIG. 4B shows a schematic diagram of the ranges of voltage values which can be taken by the capacitance line Cs when the voltage value of the capacitance line Cs is varied in a moving image display period and a still image display period. The video data voltage Vvi takes a value within a certain range from a maximum value Vmax to a minimum value Vmin, as shown in FIG. 4B. Therefore, the voltage value of the capacitance line Cs is adjusted to not less than the maximum value Vmax of the video data voltage Vvi in the moving image display period, and adjusted to not more than the maximum value Vmin of the video data voltage Vvi in the still image display period.

Figure 5A:
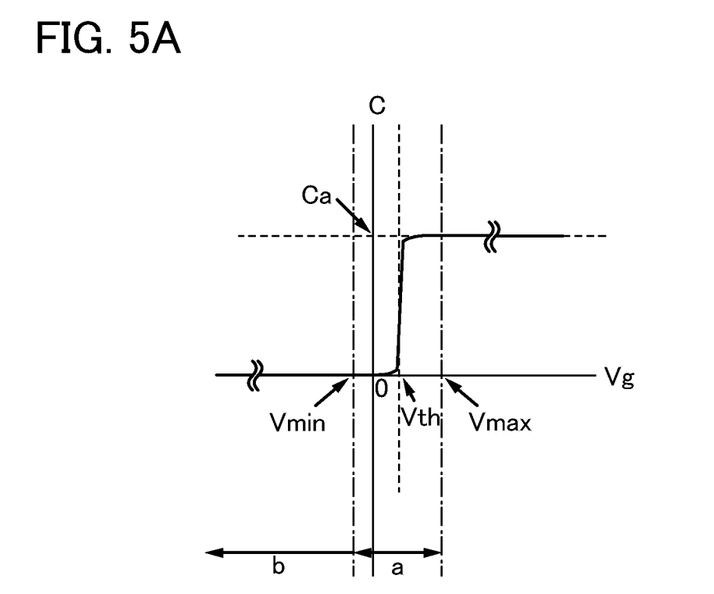
FIGS. 5A and 5B are diagrams showing capacitance-voltage characteristics.
Figure 5B:
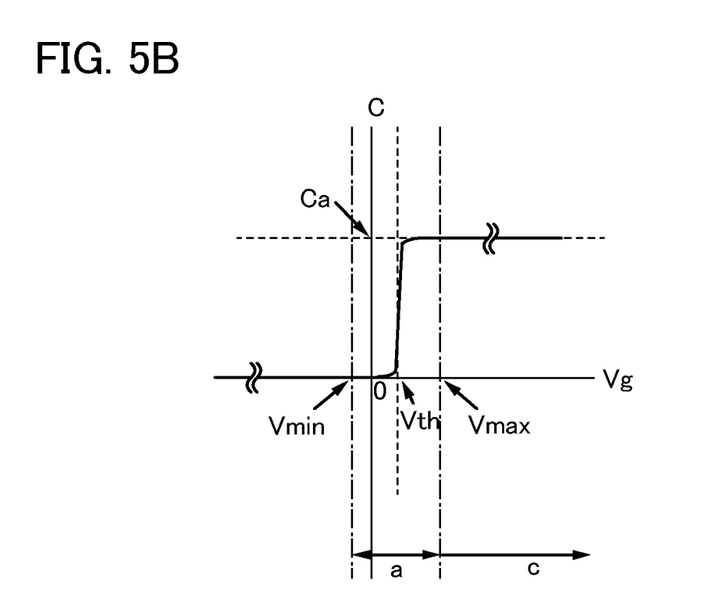

In FIGS. 5A and 5B, ranges are referred to as a, b, and c respectively when the voltage Vg of the gate electrode of the second capacitive element 20 takes a value from the maximum value Vmax of the video data voltage Vvi to the minimum value Vmin thereof, takes a value not more than the minimum value Vmin of the video data voltage Vvi, and takes a value not less than the maximum value Vmax of the video data voltage Vvi.

When the voltage value of the capacitance line Cs is adjusted to not less than the maximum value Vmax of the video data voltage Vvi, the voltage value Vg of the gate electrode of the second capacitive element 20 takes a value not more than the minimum value Vmin of the video data voltage Vvi. From FIG. 5A, it is determined that when the voltage value Vg of the gate electrode of the second capacitive element 20 takes any value within the range b, the capacitance value of the second capacitive element 20 fails to take any value.

More specifically, in the moving image display period, the voltage value of the capacitance line Cs electrically connected to the one electrode of the first capacitive element 10 and the one electrode of the second capacitive element 20 takes a value not less than the maximum value Vmax of the video data voltage Vvi, and the second capacitive element 20 as a MOS capacitor thus fails to function at all. Therefore, only the first capacitive element 10 functions in the pixel 110.

When the voltage value of the capacitance line Cs is adjusted to not more than the minimum value Vmin of the video data voltage Vvi, the voltage value Vg of the gate electrode of the second capacitive element 20 takes a value not less than the maximum value Vmax of the video data voltage Vvi. From FIG. 5B, it is determined that when the voltage value Vg of the gate electrode of the second capacitive element 20 takes any value within the range c, the capacitance value of the second capacitive element 20 takes a certain value Ca.

More specifically, in the still image display period, the voltage value of the capacitance line Cs electrically connected to the one electrode of the first capacitive element 10 and the one electrode of the first capacitive element 10 takes a value not more than the minimum value Vmin of the video data voltage Vvi, and the second capacitive element 20 as a MOS capacitor thus does function. Therefore, the first capacitive element 10 and the second capacitive element 20 do function in the pixel 110.

Thus, the above-described configuration allows switching of the capacitance value between the both periods of the moving image display period and the still image display periods by adjusting the voltage value of the capacitance line Cs. More specifically, depending on images displayed, the capacitance value in the pixel can be varied so as to be most suitable for each pixel accordingly in response to the value of the drastically varying frame frequency. In particular, in the case of driving the pixel at an extremely high frame frequency as in color display by a sequential method, the capacitance value in the pixel can be further reduced, thus achieving high integration and downsizing of the liquid crystal display device. More specifically, a desirable capacitance value can be set efficiently for the pixel, thus allowing the power consumption of the entire liquid crystal display device to be reduced.

In addition, the above-described configuration can control the capacitance value of all the pixels independently by adjusting the voltage value of the capacitance line Cs electrically connected to the one electrode of the first capacitive element 10 and the one electrode of the second capacitive element 20, thus eliminating the need to install wiring uselessly. For this reason, the parasitic capacitance caused by an overlap between adjacent wirings can be reduced to obtain a higher-definition liquid crystal display device. In addition, independently of the channel width of the pixel transistor 300, an appropriate storage capacitor can be ensured in the pixel, thus making it easy to achieve high integration in the liquid crystal display device.

Embodiment 2

In the present embodiment, another pixel structure and a method for switching the storage capacitors will be described in a liquid crystal display device according to an embodiment of the present invention disclosed herein. It is to be noted that the liquid crystal display device described in the present embodiment includes pixels each with a variable capacitance value in response to images displayed.

Figure 6:
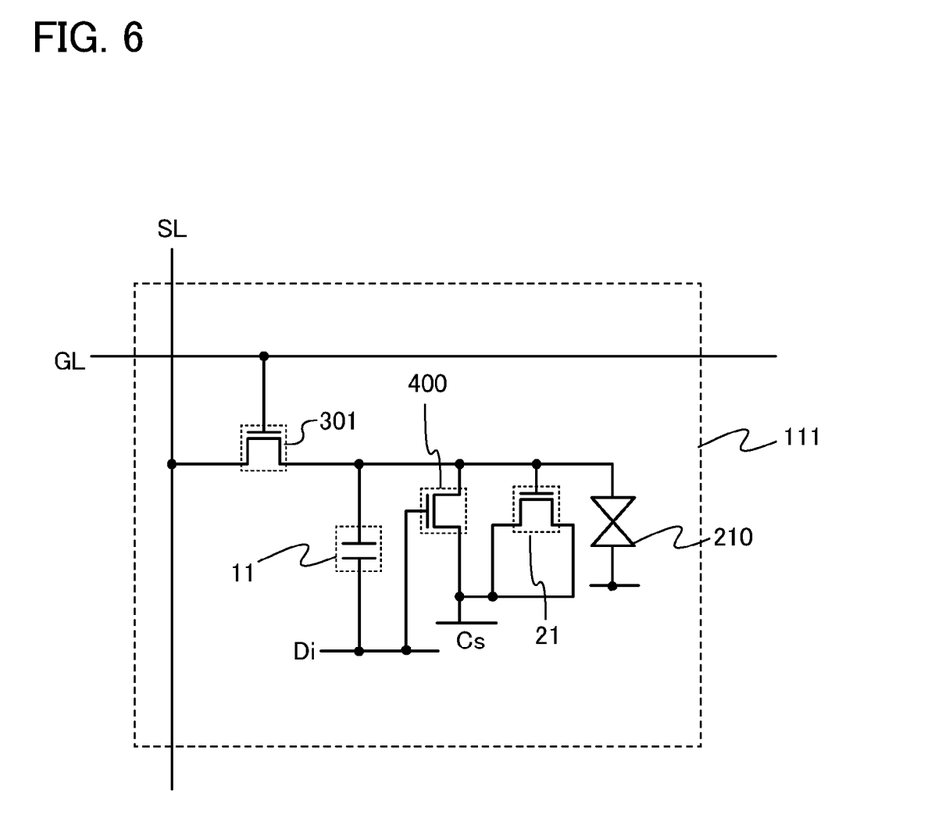
FIG. 6 is a circuit diagram illustrating a pixel structure of a liquid crystal display device.

FIG. 6 is a diagram illustrating a circuit example of a pixel included in the liquid crystal display device.

A pixel 111 includes a pixel transistor 301, a transistor 400, a first capacitive element 11, and a second capacitive element 21. The pixel transistor 301 has a gate electrode electrically connected to a scan line GL, and a first electrode electrically connected to a signal line SL, which serves as one of a source electrode and a drain electrode of the pixel transistor 301. Furthermore, one electrode of the first capacitive element 11 is electrically connected to a gate electrode of the transistor 400, a first electrode which serves as one of a source electrode and a drain electrode of the transistor 400 is electrically connected to one electrode of the second capacitive element 21, and a second electrode which serve as the other of the source electrode and the drain electrode of the pixel transistor 301, the other electrode of the first capacitive element 11, a second electrode which serve as the other of the source electrode and the drain electrode of the transistor 400, and the other electrode of the second capacitive element 21 are electrically connected to each other.

Further, the gate electrode of the transistor 400 and the one electrode of the first capacitive element 11 are electrically connected to a wiring Di for shielding, and the first electrode which serves as one of the source electrode and the drain electrode of the transistor 400 and the one electrode of the second capacitive element 21 are electrically connected to the capacitance line Cs. Furthermore, such an electric potential that turns off the transistor 400 at least during image display is supplied to the wiring Di for shielding.

Figure 7:
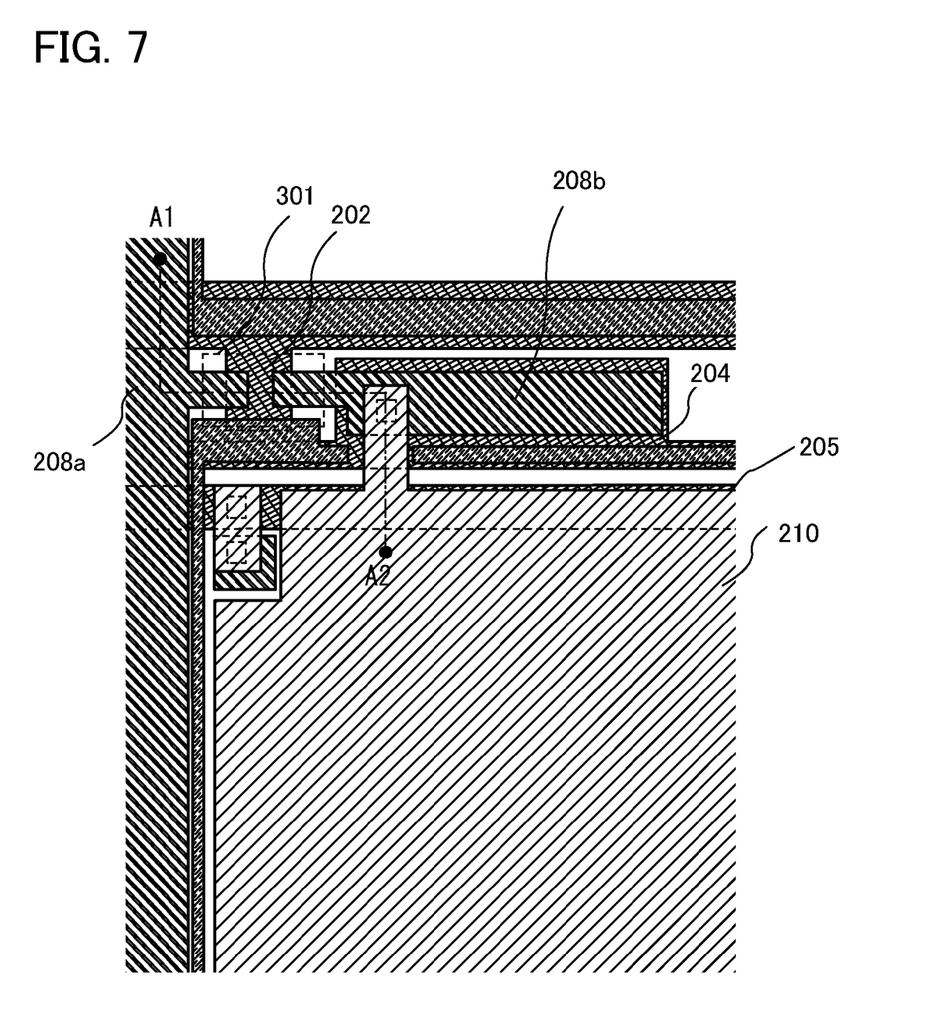
FIG. 7 is a top view illustrating a pixel structure of the liquid crystal display device.
Figure 8:
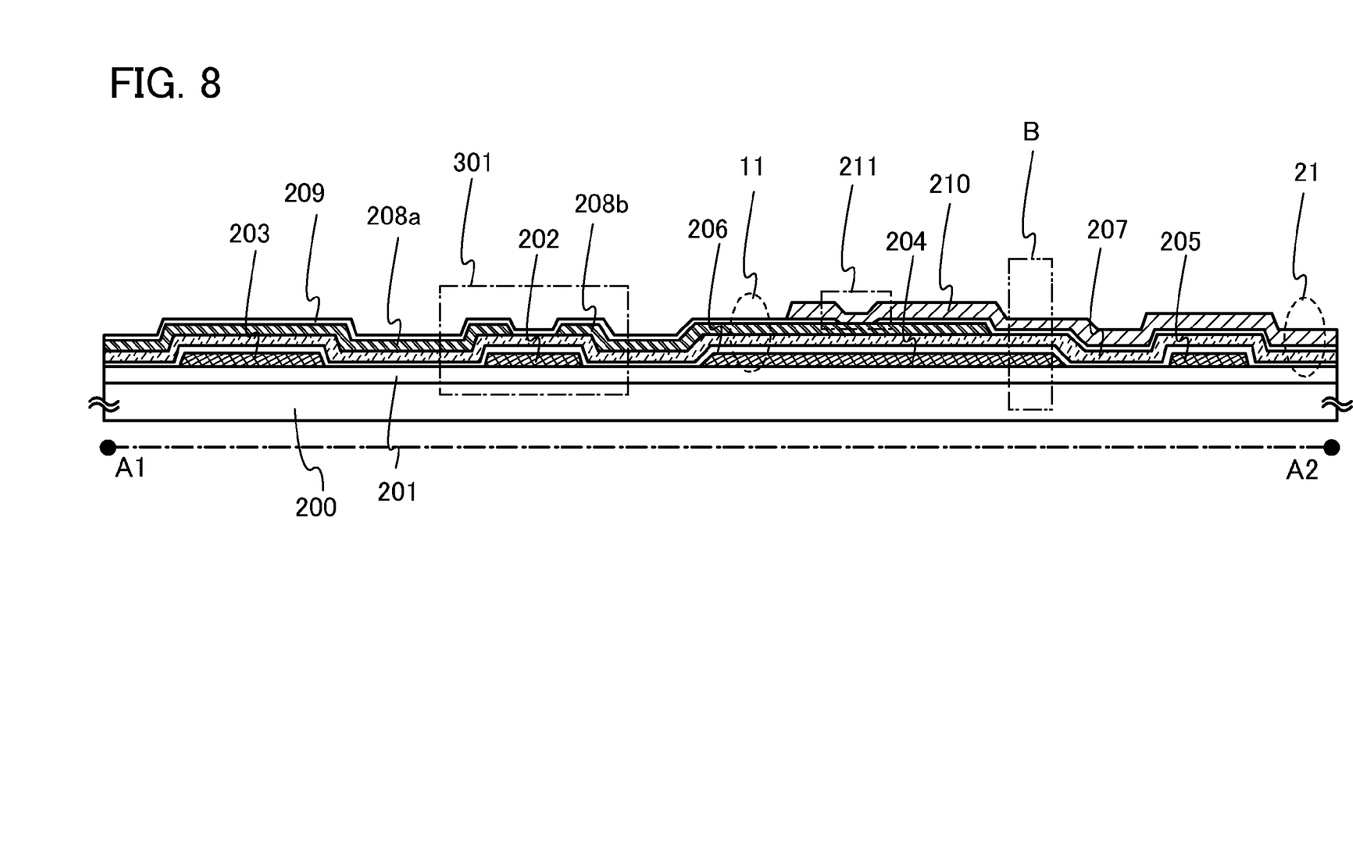
FIG. 8 is a cross-sectional view illustrating a pixel structure of the liquid crystal display device.

Next, an example of the specific structure of the pixel shown in FIG. 6 will be described with reference to FIGS. 7 and 8. FIG. 7 shows a top view of the pixel. In addition, FIG. 8 shows a cross-sectional view of the pixel along the chain line A1-A2 in FIG. 7.

In the cross section A1-A2, a base layer 201 is formed on a substrate 200, and a gate electrode 202, a wiring 203, a wiring 204, and a wiring 205 are formed on the base layer 201. In addition, a gate insulating layer 206 and a semiconductor layer 207 is formed to cover the gate electrode 202, the wiring 203, the wiring 204, and the wiring 205. In addition, a source electrode 208*a* and a drain electrode 208*b* on the semiconductor layer 207. In addition, an insulating layer 209 is formed on the source electrode 208*a* and the drain electrode 208*b* so as to be in partial contact with the semiconductor layer 207. A pixel electrode 210 is formed on the insulating layer 209. Further, the pixel electrode 210 is electrically connected to the drain electrode 208*b* through a contact hole 211 formed in the insulating layer 209.

A section in which the wiring 204 and the drain electrode 208*b* are overlapped with the gate insulating layer 206 and the semiconductor layer 207 interposed therebetween functions as the first capacitive element 11. The gate insulating layer 206 and the semiconductor layer 207 function as dielectric layers. In addition, a section in which the semiconductor layer 207 and the pixel electrode 210 are overlapped with the gate insulating layer 209 interposed therebetween functions as the second capacitive element 21. The insulating layer 209 functions as a dielectric layer.

The multilayer structure of the dielectric layer can prevent interlayer short circuit caused by pinholes, etc. formed in the insulating layers. More specifically, even when a pinhole is caused in one of the dielectric layers, the pinhole is covered with the other dielectric layer, and the function of the first capacitive element 11 can be thus improved.

The pixel transistor 301 configured with the use of the oxide semiconductor for the semiconductor layer 207 can reduce the off-state current, and reduce the ratio of electric charges disappearing from the storage capacitor provided in the pixel. More specifically, even when the frame frequency is lowered, the pixel transistor 301 makes it possible to keep electric charges held in the storage capacitor until the next writing period.

For the pixel electrode 210, a light-transmitting conductive material is preferably used. As the light-transmitting conductive material, materials can be used such as an indium tin oxide containing a silicon oxide (ITSO), an indium tin oxide (ITO), a zinc oxide (ZnO), an indium zinc oxide (IZO), and a gallium-doped zinc oxide (GZO). It is to be noted that the light-transmitting conductive material refers to a material which has a visible light transmittance of 75% to 100% in the specification.

The use of the oxide semiconductor for the semiconductor layer 207 and the use of the light-transmitting conductive material for the pixel electrode 210 make it possible to form the light-transmitting second capacitive element 21. Therefore, the aperture ratio of the pixel 111 can be improved. When the area of the second capacitive element 21 accounts for 70 percent or more or 80 percent or more of the pixel pitch, a liquid crystal display device can be achieved which has a further improved aperture ratio. It is to be noted the pixel pitch refers to the area of a region surrounded by both the distance between adjacent signal lines as a side and the distance between adjacent scan lines as another side.

Next, a specific method for varying the value of the storage capacitor will be described for the pixel shown in FIGS. 6 through 8.

The second capacitive element 21 formed of the semiconductor layer 207 and the pixel electrode 210 overlapped with the insulating layer 209 interposed therebetween constitutes a MOS capacitor. The MOS capacitor has the characteristics of, as shown in FIG. 4A, failing to function as a capacitive element when the voltage value is lower than a certain threshold voltage Vth, and functioning as a capacitive element only when the voltage value is the certain threshold voltage Vth or more.

FIG. 4B shows a schematic diagram of the ranges of voltage values which can be taken by the capacitance line Cs when the voltage value of the capacitance line Cs is varied in a moving image display period and a still image display period. The video data voltage Vvi takes a value within a certain range from a maximum value Vmax to a minimum value Vmin, as shown in FIG. 4B. Therefore, the voltage value of the capacitance line Cs is adjusted to not less than the maximum value Vmax of the video data voltage Vvi in the moving image display period, and adjusted to not more than the maximum value Vmin of the video data voltage Vvi in the still image display period.

It is to be noted that the wiring Di for shielding is placed in the pixel 111 for preventing conduction in a region B in FIG. 8. Therefore, there is a need to supply such an electric potential that turns off the transistor 400 at least during image display, to the wiring Di for shielding, which is electrically connected to the gate electrode of the transistor 400.

When the voltage value of the capacitance line Cs is adjusted to not less than the maximum value Vmax of the video data voltage Vvi, the voltage value Vg of the gate electrode of the second capacitive element 21 takes a value not more than the minimum value Vmin of the video data voltage Vvi. From FIG. 5A, it is determined that when the voltage value Vg of the gate electrode of the second capacitive element 21 takes any value within the range b, the capacitance value of the second capacitive element 21 fails to take any value.

More specifically, in the moving image display period, the voltage value of the capacitance line Cs electrically connected to the one electrode of the second capacitive element 21 and the first electrode which serves as one of the source electrode and the drain electrode of the transistor 400 takes a value not less than the maximum value Vmax of the video data voltage Vvi, and the second capacitive element 21 as a MOS capacitor thus fails to function at all. Therefore, only the first capacitive element 11 functions in the pixel 111.

When the voltage value of the capacitance line Cs is adjusted to not more than the minimum value Vmin of the video data voltage Vvi, the voltage value Vg of the gate electrode of the second capacitive element 21 takes a value not less than the maximum value Vmax of the video data voltage Vvi. From FIG. 5B, it is determined that when the voltage value Vg of the gate electrode of the second capacitive element 21 takes any value within the range c, the capacitance value of the second capacitive element 21 takes a certain value Ca.

More specifically, in the still image display period, the voltage value of the capacitance line Cs electrically connected to the one electrode of the second capacitive element 21 and the first electrode which serves as one of the source electrode and the drain electrode of the transistor 400 takes a value not more than the minimum value Vmin of the video data voltage Vvi, and the second capacitive element 21 as a MOS capacitor thus does function. Therefore, the first capacitive element 11 and the second capacitive element 21 do function in the pixel 111.

Thus, the above-described configuration allows switching of the capacitance value between the both periods of the moving image display period and the still image display periods by adjusting the voltage value of the capacitance line Cs. More specifically, depending on images displayed, the capacitance value in the pixel can be varied so as to be most suitable for each pixel accordingly in response to the value of the drastically varying frame frequency. In particular, in the case of driving the pixel at an extremely high frame frequency as in color display by a sequential method, the capacitance value in the pixel can be further reduced, thus achieving high integration and downsizing of the liquid crystal display device. More specifically, a desirable capacitance value can be set efficiently for the pixel, thus allowing the power consumption of the entire liquid crystal display device to be reduced.

In addition, the above-described configuration can control the capacitance value of the entire pixel independently by adjusting the voltage value of the capacitance line Cs electrically connected to the one electrode of the second capacitive element 21 and the first electrode which serves as one of the source electrode and the drain electrode of the transistor 400, thus eliminating the need to install wiring uselessly. For this reason, the parasitic capacitance caused by an overlap between adjacent wirings can be reduced to obtain a higher-definition liquid crystal display device. In addition, independently of the channel width of the pixel transistor 301, an appropriate storage capacitor can be ensured in the pixel, thus making it easy to increase the integration in the liquid crystal display device.

This application is based on Japanese Patent Application serial no. 2010-206282 filed with Japan Patent Office on Sep. 15, 2010, the entire contents of which are hereby incorporated by reference.

What is claimed is:

1. A semiconductor device comprising:
   a transistor including a gate electrode electrically connected to a scan line, a first electrode electrically connected to a signal line, and a second electrode electrically connected to a pixel electrode;
   a first capacitive element including one electrode electrically connected to the second electrode, and the other electrode electrically connected to a capacitance line; and
   a second capacitive element including one electrode electrically connected to the second electrode,
   wherein the second capacitive element has a capacitance value variable by adjusting an electric potential of the capacitance line depending upon whether an image to be displayed by the pixel electrode is a still image or a moving image.

2. The semiconductor device according to claim 1, wherein the pixel electrode and semiconductor layer of the transistor have a light-transmitting property.

3. The semiconductor device according to claim 1, wherein a semiconductor layer of the transistor comprises an oxide semiconductor.

4. The semiconductor device according to claim 1, wherein the second capacitive element has a MOS capacitor structure with a dielectric layer interposed between the one electrode and the other electrode.

5. The semiconductor device according to claim 1,
   wherein the one electrode of the second capacitive element is formed from the same layer as the pixel electrode, and
   wherein the other electrode of the second capacitive element is formed from the same semiconductor material as a semiconductor layer of the transistor.

6. The semiconductor device according to claim 1, wherein a dielectric layer of the first capacitive element or the second capacitive element has a multilayer structure.

7. The semiconductor device according to claim 1, wherein the other electrode of the second capacitive element is electrically connected to the capacitance line.

8. The method according to claim 6, wherein the other electrode of the second capacitive element is electrically connected to the capacitance line.

9. A method for driving a display device at frame frequencies comprising:
   a transistor including a gate electrode electrically connected to a scan line, a first electrode electrically connected to a signal line, and a second electrode electrically connected to a pixel electrode;
   a first capacitive element including one electrode electrically connected to the second electrode, and the other electrode electrically connected to a capacitance line; and
   a second capacitive element including one electrode electrically connected to the second electrode,
   the method comprising a step of:
   adjusting an electric potential of the capacitance line depending upon the frame frequencies so that a capacitance value of the second capacitive element is adjusted.

10. The method according to claim 9,
    wherein the one electrode of the second capacitive element is formed from the same layer as the pixel electrode, and
    wherein the other electrode of the second capacitive element is formed from the same semiconductor material as a semiconductor layer of the transistor.

11. The method according to claim 9, wherein a semiconductor layer of the transistor comprises an oxide semiconductor.

* * * * *